United States Patent
Cho et al.

(10) Patent No.: US 7,478,954 B2
(45) Date of Patent: Jan. 20, 2009

(54) STRUCTURE AND METHOD FOR OPTICAL CONNECTION BETWEEN OPTICAL TRANSMITTER AND OPTICAL RECEIVER

(75) Inventors: In Kui Cho, Daejeon (KR); Woo Jin Lee, Daejeon (KR); Sang Pil Han, Daejeon (KR); Seung Ho Ahn, Daejeon (KR); Gyung Ock Kim, Seoul (KR); Hee Kyung Sung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/737,255

(22) Filed: Apr. 19, 2007

(65) Prior Publication Data

US 2008/0075408 A1 Mar. 27, 2008

(30) Foreign Application Priority Data

Sep. 27, 2006 (KR) ............... 10-2006-0094172

(51) Int. Cl.
*G02B 6/43* (2006.01)
*G02B 6/30* (2006.01)
*G02B 6/36* (2006.01)

(52) U.S. Cl. ............... 385/89; 385/49; 385/88
(58) Field of Classification Search ............... None
See application file for complete search history.

(56) References Cited

U.S. PATENT DOCUMENTS

| | | | |
|---|---|---|---|
| 5,761,350 A | | 6/1998 | Koh |
| 6,097,871 A * | | 8/2000 | De Dobbelaere et al. .... 385/129 |
| 6,185,348 B1 * | | 2/2001 | Shahid ............... 385/49 |
| 6,336,816 B1 * | | 1/2002 | Yatskov et al. ............... 439/67 |
| 6,390,690 B1 * | | 5/2002 | Meis et al. ............... 385/88 |
| 6,524,017 B2 * | | 2/2003 | Lecocq et al. ............... 385/88 |
| 6,694,083 B2 * | | 2/2004 | Paradiso et al. ............... 385/135 |
| 6,736,552 B2 * | | 5/2004 | Martwick ............... 385/88 |
| 6,793,405 B1 | | 9/2004 | Murata et al. |
| 6,905,260 B2 * | | 6/2005 | Anderson et al. ............... 385/91 |
| 6,960,029 B2 | | 11/2005 | Iijima et al. |
| 7,220,062 B2 * | | 5/2007 | Durrant et al. ............... 385/88 |

(Continued)

FOREIGN PATENT DOCUMENTS

EP   1202095   5/2005

(Continued)

*Primary Examiner*—Tina M Wong
(74) *Attorney, Agent, or Firm*—Ladas & Parry LLP

(57) ABSTRACT

Provided are a method and structure for optical connection between an optical transmitter and an optical receiver. The method includes the steps of: forming on a substrate a light source device, an optical detection device, an optical transmission unit electrically connected with the light source device, and an optical detection unit electrically connected with the optical detection device; preparing a flexible optical transmission-connection medium to optically connect the light source device with the optical detection device; cutting the prepared optical transmission-connection medium and surface-finishing it; and connecting one end of the surface-finished optical transmission-connection medium with the light source device and the other end with the optical detection device. Fabrication of an optical package having a 3-dimensional structure is facilitated and fabrication time is reduced, thus improving productivity. In addition, since the optical transmission-connection medium is directly connected with the light source device and the optical detection device, a polishing operation or additional connection block is not required, thus facilitating mass production.

5 Claims, 5 Drawing Sheets

U.S. PATENT DOCUMENTS

2005/0053336 A1 * 3/2005 Ito et al. ....................... 385/89

FOREIGN PATENT DOCUMENTS

| JP | 06-232505 | 8/1994 |
| JP | 2004-264592 | 9/2004 |
| JP | 2005-274839 | 10/2005 |
| KR | 1020000071043 | 11/2000 |
| KR | 1020000071085 | 11/2000 |
| KR | 2003-0013075 A | 2/2003 |
| KR | 2004-0027162 A | 4/2004 |
| KR | 1020040089014 | 10/2004 |
| KR | 10-0696210 B1 | 3/2007 |

* cited by examiner (a)

(b)

STRUCTURE AND METHOD FOR OPTICAL CONNECTION BETWEEN OPTICAL TRANSMITTER AND OPTICAL RECEIVER

CROSS-REFERENCE TO RELATED APPLICATION

This application claims priority to and the benefit of Korean Patent Application No. 2006-94172, filed Sep. 27, 2006, the disclosure of which is incorporated herein by reference in its entirety.

BACKGROUND

1. Field of the Invention

The present invention relates to a method for optical connection between an optical transmitter and an optical receivers and a structure for optical connection fabricated using the same. More particularly, the present invention relates to an optical connection method and structure for connecting an optical transmitter with an optical receiver using flexible optical connection/transmission media, e.g. plastic optical fibers or flexible optical waveguides.

In addition, the present invention relates to an optical connection structure and method for connecting an optical transmitter and an optical receiver on a printed circuit board (PCB) of an optical transmission system to solve the problem of an electromagnetic field generated by signal transfer in a conventional electrical circuit.

2. Discussion of Related Art

Ongoing development in the field of integrated circuit (IC) technology is pushing the limits of operating speed and integration density, resulting in the rapid development of new high-performance microprocessors and high-capacity memory chips. In order to effectively apply cutting-edge IC technology to a next-generation information and communication system capable of switching at more than a terabit per second (Tb/s) and transmitting mass amounts of information at high speed, improvement in signal processing capability is prerequisite. Simply put, this translates into need for higher signal transfer speed and higher line density.

However, as information is usually transferred by means of an electrical signal over a relatively short distance such as between two boards or between two chips, there is a limit to increasing signal transfer speed and line density. This limit arises from the inevitable problems of signal delay due to the resistance of the line itself and electromagnetic interference (EMI) generated as signal transfer and line density increase. Thus, there is need for an alternative strategy for realizing a high-speed system.

In order to solve these problems, a variety of connection methods are being suggested that apply optical interconnection technology using polymer and glass fibers. As an example, an optical PCB (OPCB) made Lip of a PCB into vehicle an optical waveguide is inserted has been devised. The optical waveguide and a glass substrate guide optical signals to perform high-speed data communication, and a copper trace pattern is formed in the same board to convert the optical signals into electrical signals for data storing/signal processing in a device.

A method for manufacturing a 3-dimensional optical interconnection block is disclosed in Korean Laid-Open Patent No. 10-2005-0074417. The method comprises the steps of: inserting at least one optical fiber array into an opening of at least one optical connector to connect them with each other; inserting the structure of the optical connector connected through the optical fiber array into a guide groove of a sustaining block to combine them with each other; inserting a solid body into the combined sustaining block to fix the optical fiber array connected with the optical connector in the sustaining block; and cutting the optical connector to separate the sustaining block from the optical connector along X, Y and Z-axes to form an optical connection block to which the optical fiber array is fixed by the solid body.

However, when optical fibers are connected by forming an optical connection block as described above, a device and apparatus for optical coupling, such as an optical connection block, should be devised. The optical coupling device is both expensive to build and difficult to precisely attach.

In addition, as optical transmission-connection media for connecting optical devices with each other, optical fibers and optical waveguides are frequently used. In general, single-mode glass optical fibers are used for long-distance transmission, multimode glass optical fibers are used for short (300 m or less) and very short (1 nm or less) distances, and optical waveguides mainly using polymer are frequently used for chip-scale optical transmission. However, when an optical fiber does not have a jacket, it lacks flexibility. Also, finishing of a cut end is not easy and requires a dedicated cutting machine.

SUMMARY OF THE INVENTION

The present invention is directed to a structure and method for optical connection between an optical transmitter and an optical receiver, which simplify a fabrication process, can be easily applied regardless of various device modifications, and can reduce time taken to assemble an optical connection structure.

The present invention is also directed to a structure and method for optical connection applying a general electrical circuit chip packaging technique to package an optical transmitter and an optical receiver.

One aspect of the present invention provides a method for optical connection between an optical transmitter and an optical receiver, comprising the steps of: (a) forming on a substrate a light source device, an optical detection device, an optical transmission unit electrically connected with the light source device, and an optical detection unit electrically connected with the optical detection device; (b) preparing a flexible optical transmission connection medium to optically connect the light source device formed on the substrate with the optical detection device; (c) cutting the prepared optical transmission-connection medium and surface-finishing it; and (d) directly connecting one end of the surface-finished optical transmission-connection medium with the light source device and the other end with the optical detection device.

Step (c) of surface-finishing the optical transmission-connection medium may comprise the steps of: cutting the optical transmission-connection medium using a cutting machine, and thermally annealing the cut end of the optical transmission-connection medium using a soldering iron. Step (d) of connecting the optical transmission-connection medium with the light source device and the optical detection device may comprise the steps of: applying an adhesive to regions of the light source device and the optical detection device; connecting ends of the optical transmission-connection medium, to which the adhesive is applied, to the region of the light source device and the optical detection device; and irradiating the regions of the light source device and the optical detection device to which the optical transmission-connection medium is connected with ultraviolet light.

The method may further comprise the step of, when one end of the optical transmission-connection medium is connected to the region of the light source device or the optical detection device, connecting an optical power meter to the other end of the optical transmission-connection medium and checking whether or not the light source device or the optical detection device is properly connected with the optical transmission-connection medium. The method may further comprise the step of, when one end of the optical transmission-connection medium is connected with the light source device or the optical detection device after the other end of the optical transmission-connection medium is connected to the light source device or the optical detection device, driving the optical transmission unit or the optical detection unit and checking whether or not the light source device or the optical detection device is properly connected with the optical transmission-connection medium.

The optical transmission-connection medium may be a plastic optical fiber or a flexible optical waveguide. The flexible optical waveguide may take the form of a two-dimensional sheet with a polyimide film attached to it.

Another aspect of the present invention provides a structure for optical connection between an optical transmitter and an optical receivers comprising: an optical transmission unit for transmitting a signal applied through an electrical signal line formed on a substrate; a light source device electrically connected with the optical transmission unit, converting the applied signal into light and emitting it; an optical detection device optically connected with the light source device and detecting the light converted and emitted by the light source device; an optical detection unit electrically connected with the optical detection device and converting the light received at the optical detection device into an electrical signal; and a flexible optical transmission-connection medium whose one end is connected with the light source device and whose other end is directly connected with the optical detection device.

The flexible optical transmission-connection medium may be a plastic optical fiber or a flexible optical waveguide. The plastic optical fiber or the flexible optical waveguide may be used in a single mode for long-distance transmission of an optical signal, and used in a multimode for short-distance transmission or very-short-distance transmission of an optical signal. The substrate may be a printed circuit board (PCB) or an optical bench.

BRIEF DESCRIPTION OF THE DRAWINGS

The above and other objects, features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described to make this disclosure sufficiently detailed and comprehensive to enable one of ordinary skill in the art to embody and practice the invention.

Figure 1:
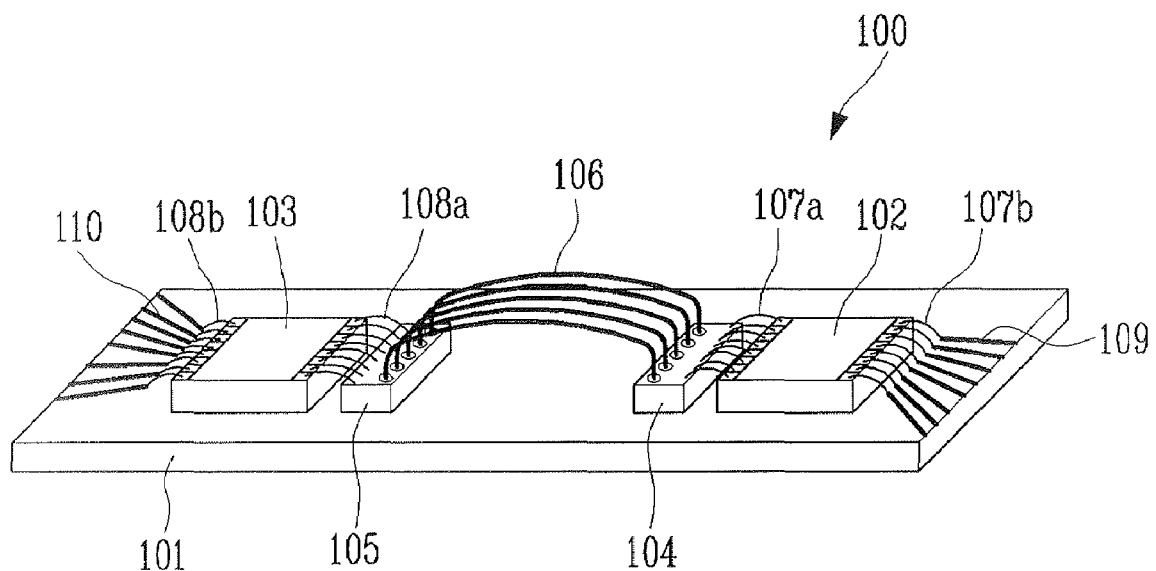
FIG. 1 is a perspective view of an optical connection system according to an exemplary embodiment of the present invention.

FIG. 1 is a schematic perspective view of a structure for optical connection between an optical transmitter and an optical receiver according to an exemplary embodiment of the present invention. The illustrated structure is used for high-speed signal transfer over a very short distance, such as between general chips.

Referring to FIG. 1, an optical connection structure 100 comprises an optical transmission unit 102 and an optical detection unit 103 formed on a substrate 101, a light source device 104 and an optical detection device 105, optical transmission-connection media 106 optically connecting the light source device 104 with the optical detection device 105, and first electrical signal lines 109 receiving a signal from outside and second electrical signal lines 110 providing a signal to outside.

More specifically, an optical printed circuit board (OPCB) or silicon optical bench that neither causes nor is susceptible to electromagnetic interference (EMI) is used for the substrate 101. The light source device 104 and the optical detection device 105 optically connected with the light source device 104 and detecting light emitted from the light source device 104 are formed on the substrate 101 implemented by an OPCB or a silicon optical bench.

In order to transfer the optical signal from the light source device 104 to the optical detection device 105 without loss, the optical transmission-connection media 106 are formed between the light source device 104 and the optical detection device 105. Plastic optical fibers or flexible optical waveguides may be used as the optical transmission-connection media 106 because they are easier to cut and bard-face the cut ends than conventional glass optical fibers or polymer optical waveguides. Other types of optical fibers and waveguides may also be used according to transmission distance.

Plastic optical fibers have never been used as inter-chip optical transmission-connection media such as the optical transmission-connection media 106. Currently, plastic optical fibers have a minimum core diameter of about 500 μm and are used in lighting and display technology, and as jump cables of a few high-performance audio systems. Plastic optical fibers used in the present invention may have a core (not shown in the drawings) diameter reduced to 8 to 62.5 μm, and may have a rectangular core. Multimode plastic optical fibers having a core diameter of 50 to 62.5 μm may be used for short-distance (300 m or less) and very short-distance (1 m or less) transmission, and single-mode optical fibers having a core diameter of 7 to 8 μm may be used for long-distance transmission. When flexible optical waveguides are used, cores of the optical waveguides take the form of a 2-dimensional sheet, and a polyimide film is attached to the coverings to protect the sheet.

The light source device 104 is electrically connected with the optical transmission unit 102 by wires 107a, and the optical detection device 105 is electrically connected with the optical detection unit 103 by wires 108a. On the substrate 101, the first electrical signal lines 109 electrically connected with the optical transmission unit 102 and the second electrical signal lines 110 electrically connected with the optical detection unit 103 are formed. The optical transmission unit 102 is connected with the first electrical signal lines 109 by wires 107b, and the optical detection unit 103 is connected with the second electrical signal lines 110 by wires 108b.

In the optical connection structure 100 constituted as described above, a high-speed data signal for inter-device transmission passes through the optical transmission unit 102 along the first electrical signal lines 109 and arrives at the light source device 104, which converts the signal applied from the first electrical signal lines 109 into light. As the light source device 104, a surface emitting laser or a general laser may be used. The size of the optical transmission-connection media 106 handling transmission of the optical signal is determined according to the type of light source. The optical signal emitted for the light source device 104 passes through the optical transmission-connection media 106 and arrives at the optical detection device 105. Here, the optical transmission-connection media 106 are directly connected to the surface of the optical detection device 105. The optical signal (light) arriving at the optical detection device 105 is converted by the optical detection unit 103 into an electrical signal (current) and transmitted to the second electrical signal lines 110, thereby completing connection between two points in close proximity. With this connection method, there is almost no loss, and the specifications of all components, such as a chip, a PCB, packaging, etc., can be flexibly adjusted for packaging. Thus, it is possible to reduce the cost of optical packaging to the cost of electrical device packaging by reducing the overall cost of packaging.

FIGS. 2A to 2G are diagrams illustrating processes in a method of connecting the light source device and the optical detection device according to an exemplary embodiment of the present invention. Parts of the drawings may be drawn out of proportion for better visibility.

First, in order to connect a light source device 104 and an optical detection device 105, i.e., to perform optical link packaging, optical transmission-connection media 106 must be prepared and cut to a proper size using an appropriate tool, and then the cut end must be surface-finished. In this embodiment, plastic optical fibers are used as the optical transmission-connection media 106. More specifically, referring to FIG. 2A, the plastic optical fibers 106 prepared for optical link packaging are cut using cutting scissors 210. The plastic optical fibers 106 may be prepared in a bundle.

Figure 2A:
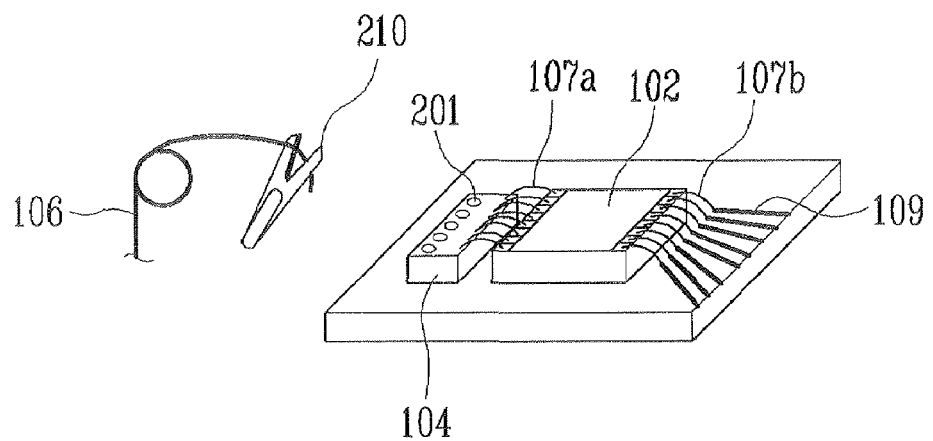
FIGS. 2A to 2G are diagrams illustrating processes in a method of connecting a light source device and an optical detection device according to an exemplary embodiment of the present invention.
Figure 2B:
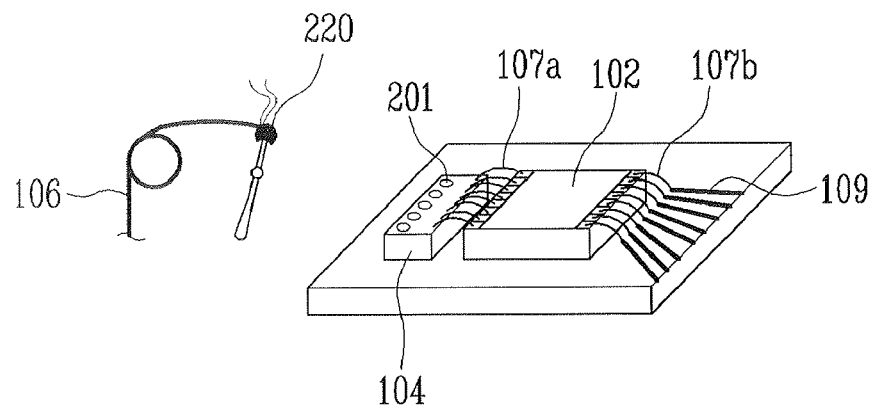

In the next step, referring to FIG. 2B, the cut ends of the cut plastic optical fibers 106 are thermally annealed. In the thermal annealing process, the cut ends of the cut plastic optical fibers 106 may be easily hard-faced using a soldering iron 220, and so on. Once the prepared plastic optical fibers 106 are cut and the cut end surface-finishing is completed, a post process of inserting the cut portions of the plastic optical fibers 106 into openings 201 formed on the light source device 104 is performed.

Figure 2C:
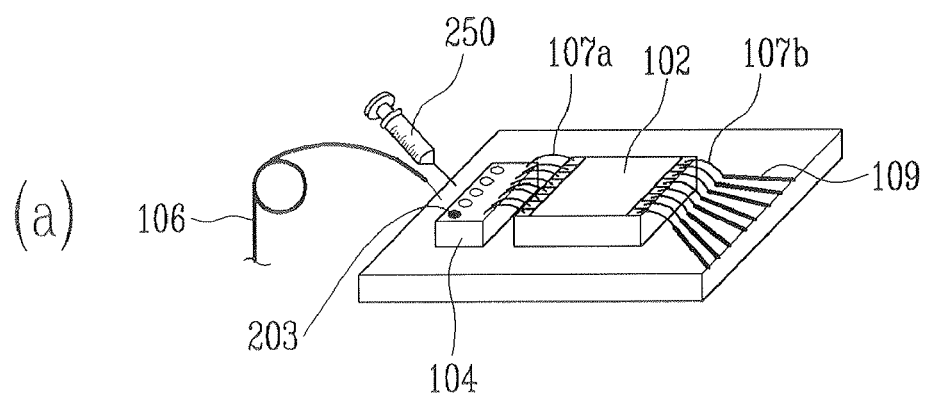
Figure 2C:
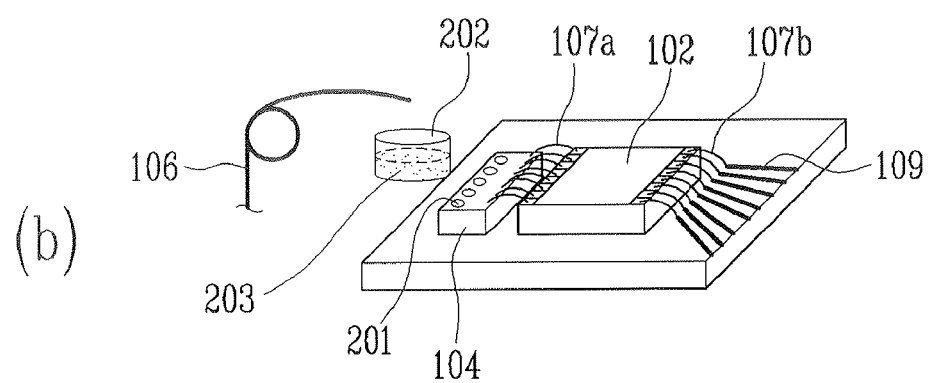

Referring to FIG. 2C(a), the cut plastic optical fibers 106 are inserted into the openings 201 of the light source device 104, and an adhesive 203 is used to fix them therein. An ultraviolet (UV) epoxy, a UV hardening resin or so on may be used as the adhesive 203. An injector 205, a pipette, or so on may be used to precisely drop the adhesive 203 into the openings 201 of the light source device 104. Alternatively, referring to FIG. 2C(b), the cut ends of the plastic optical fibers 106 are dipped in a vessel 202 containing the adhesive 203 and taken out after a predetermined time period, so that the adhesive 203 may be applied to the cut ends of the plastic optical fibers 106. In the step of applying the adhesive, one of the methods illustrated in FIGS. 2C(a) and (b) may be selected and used.

Figure 2D:
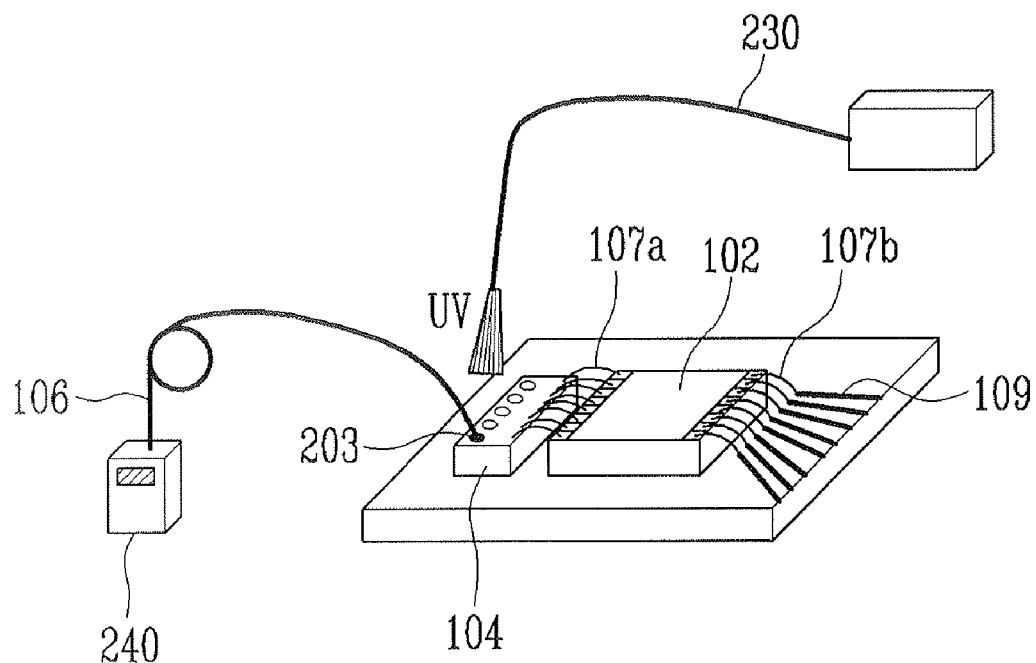

FIG. 2D illustrates a process of inserting the plastic optical fibers 106 into the openings 201 of the light source device 104 and then irradiating them with UV light using a UV irradiation device 230. Before UV irradiation, precise optical connection between the light source device 104 and the plastic optical fibers 106 must be confirmed. This includes the steps of driving the optical transmission unit 102 to cause an optical signal to be emitted from the light source device 104, connecting the other ends, i.e., connectors (e.g., subscriber connectors (SCs)), of the plastic optical fibers 106 with an optical power meter 240, and measuring the optical power.

Figure 2E:
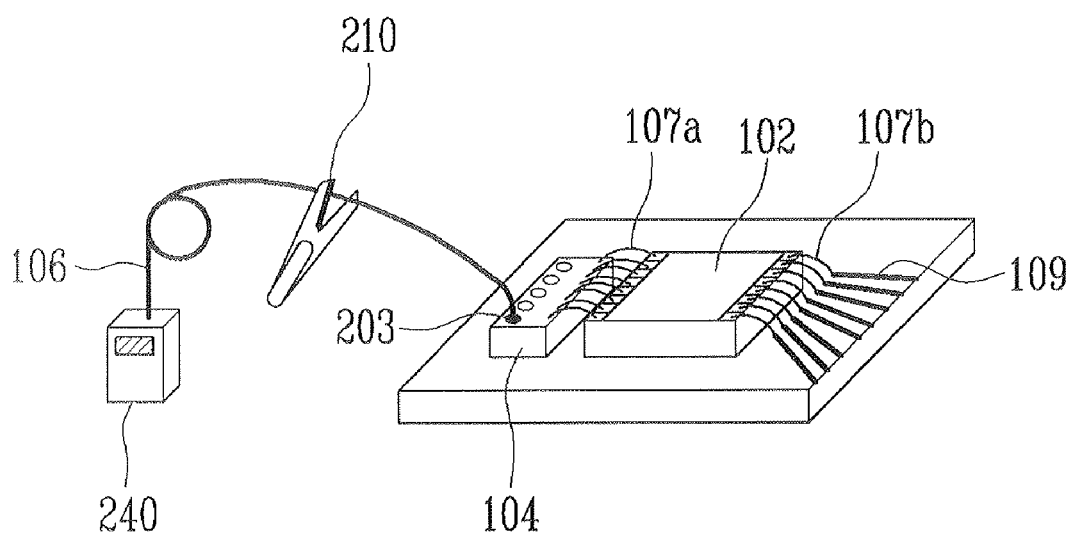
Figure 2F:
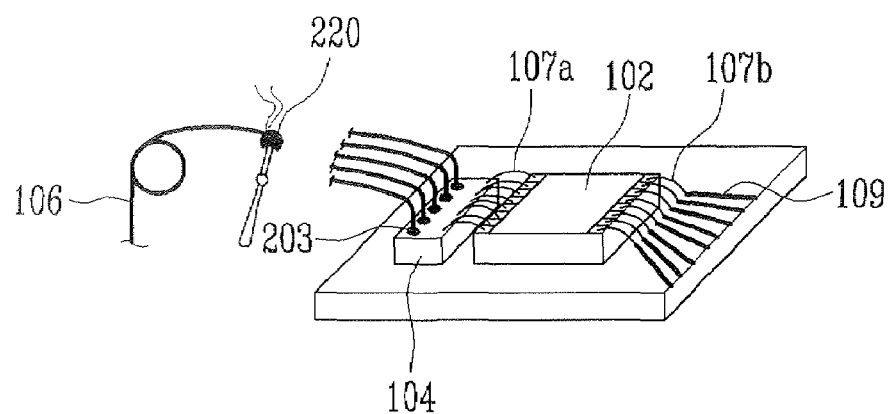
Figure 2G:
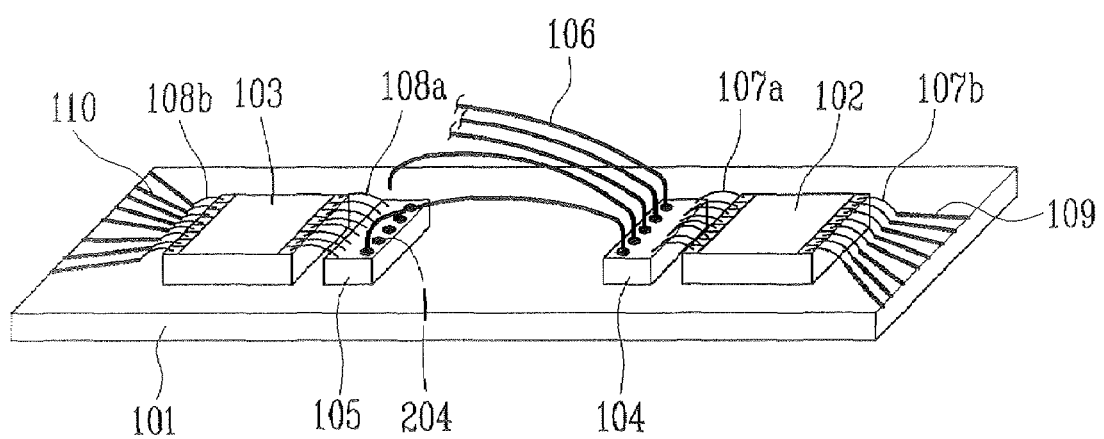

In the next step, referring to FIGS. 2E and 2F, the other ends of the plastic optical fibers 106 inserted and fixed in the openings 201 of the light source device 104 are cut off and surface-finished. As illustrated in FIGS. 2A and 2B, the other ends are cut using the cutting device 210 and then surface-finished using the heat of the soldering iron 220.

As illustrated in FIG. 2Q, the other ends of the plastic optical fibers 106 connected with the light source device 104 are inserted and fixed into openings 204 formed on the optical detection device 105. Here, the other ends of the plastic optical fibers 106 are connected with the openings 204 of the optical detection device 105 in the same way their one ends are connected with the openings 201 of the light source device 104. In order to connect the cut and surface-finished plastic optical fibers 106 with the optical detection device 105, the adhesive 203 is inserted into the openings 204 of the optical detection device 105 and then irradiated and fixed by UV light. Here, in order to confirm precise optical connection, it is preferable to connect the optical transmission unit 102 and the light source device 104 with the optical detection unit 103 and the optical detection device 105 during operation. As the UV hardening operation is performed while the intensity of the light source is metered to check optical connection of the light source device 104, optical connection of the optical detection device 105 can be checked using an amount of current proportional to the optical signal received from the light source device 104.

A method of checking whether the light source device 104 and the light detection device 105 are properly connected with the optical transmission-connection media 106 by driving the optical transmission unit 102 and the optical detection unit 103 is described above. However, another checking method for precise optical connection is to connect the optical transmission unit 102 with the optical detection unit 103 and observe the system under a microscope (not shown in the drawings).

Figure 3:
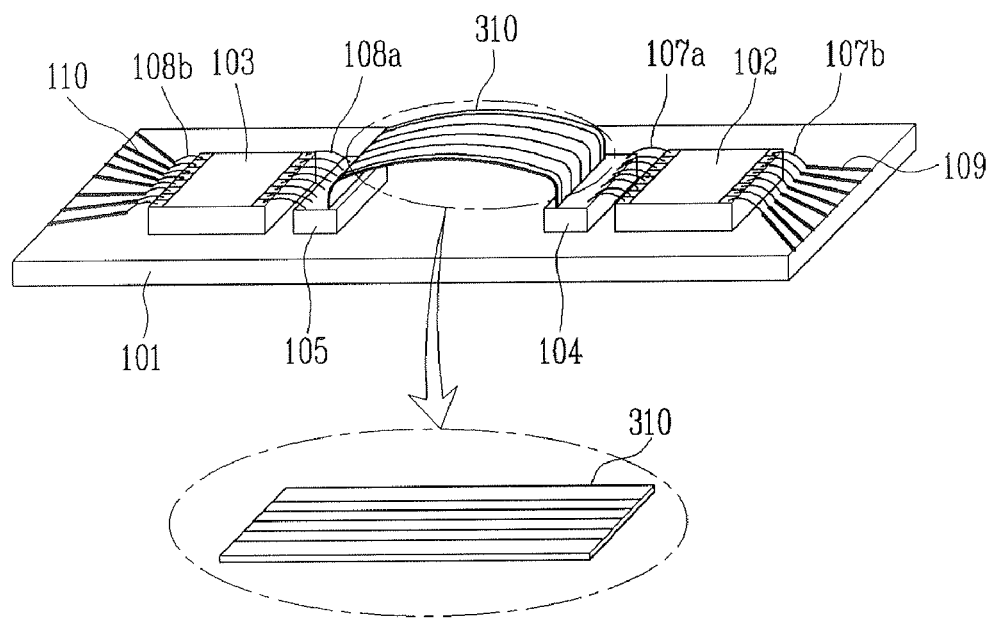
FIG. 3 is a perspective view showing an optical connection structure connecting a light source device with an optical detection device through flexible optical waveguides according to an exemplary embodiment of the present invention.

FIG. 3 is a perspective view showing an optical connection structure connecting a light source device with an optical detection device through flexible optical waveguides according to an exemplary embodiment of the present invention. In this embodiment, flexible optical waveguides 310 instead of plastic optical fibers are used as the optical transmission-connection media 106 for optical links. The flexible optical waveguides 310 may be fabricated by a molding method using a master and must be flexible. Like the plastic optical fibers 106, the flexible optical waveguides 310 are connected with a light source device 104 and an optical detection device 105 using an adhesive (a UV epoxy, etc.). A magnified portion of FIG. 3 shows the optical waveguides 310 as integrated into a single body having a flat rectangular shape. In order to connect the flexible optical waveguide 310 with the light source device 104 and the optical detection device 105, openings (not shown in the drawing) corresponding to both ends of the optical waveguides 310 must be formed on the respective devices 104 and 105.

Figure 4:
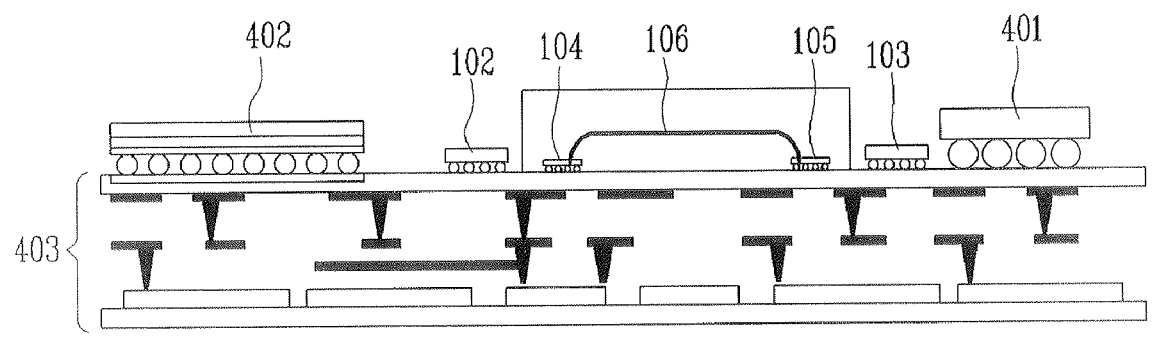
FIG. 4 is a side cross-sectional view of an optical connection system including an optical connection structure according to an exemplary embodiment of the present invention.

FIG. 4 is a schematic side cross-sectional view of an optical connection system including an optical connection structure according to an exemplary embodiment of the present invention. Referring to FIG. 4, the optical connection system can be used as an interface between chips requiring high-speed signal processing, and more particularly, for connection between a high-speed central processing unit (CPU) 401 and a control chip 402. Recent drastic increase in the sheer quantity of information being handled has generated demand for high-speed communication circuits capable of transferring signals between chips at rates of several GHz or more. The required speed of signal transfer will continue to increase into the future, as will transmission capacity per channel between chips or even within a chip. To continue this trend, it is expected that system on chip (SOC) and system in package (SIP) technology will be developed into system on package (SOP) technology, wherein easy signal connection between chips and signal integrity will be of paramount importance. Referring to FIG. 4, the various control chips 402, a complementary metal-oxide semiconductor (CMOS)/SOC chip (not shown in the drawing), and the CPU 401 are disposed on a multilayer PCB 403, and high-speed signal transfer is required between them.

Here, a light source device 104, such as a vertical cavity surface emitting laser (VCSEL) or a laser diode (LD), and a driving unit 102 driving the light source device 104 are required. In addition, after an electrical signal is converted into light by the light source device 104, optical transmission-connection media 106 are required to transmit the light (optical signal) to another chip. Here, the transmitted signal is converted back into an electrical signal and transmitted to a desired chip by an optical detection device 105, e.g., a photodetector (PD). When an optical link is established by the method suggested in the present invention, an optical module can be easily packaged. In the future, optical device driving units 102 and 103 will be embedded in the CPU, 401 and the control chips 402 by a CMOS process.

In the above-described exemplary embodiment, the optical link is easily established by converting a high-speed signal into light. And in the future, even the light source device 104 and the optical detection device 105 may be embedded in a CMOS chip.

As described above, the present invention can be applied to an interface between chips requiring high-speed signal processing, and has the effects of speeding-up the transfer of a high-speed signal and increasing transmission capacity per channel between the chips or within a chip.

In addition, unlike conventional optical connection methods, since no separate optical connection device or apparatus is required and packaging can be completed in a short time at low cost, the present invention call be easily applied to all optical devices and productivity can be improved. Even an optical device chip can be embedded in a CMOS chip by the optical link technology of the present invention, thus opening the door to the optical packaging era.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method for connecting optically an optical transmitter and an optical receiver, comprising the steps of:

forming a light source device, an optical detection device, an optical transmission unit, and an optical detection unit on a substrate, wherein the optical transmission unit is electrically connected to the light source device, and the optical detection unit is electrically connected to the optical detection device;

preparing a flexible optical transmission-connection medium for carrying optical signals so as to optically connect the light source device to the optical detection device, wherein the optical transmission-connection medium is a plastic optical fiber or a flexible optical waveguide;

cutting the prepared optical transmission-connection medium using a cutting device and thermally annealing a cut end of the optical transmission-connection medium using a soldering iron; and directly connecting one end of the optical transmission-connection medium to the light source device and directly connecting the opposite end to the optical detection device, wherein the direct connection comprises an adhesive and no separate optical connection device.

2. The method of claim 1, wherein directly connecting one end of the surface-finished optical transmission-connection medium with the light source device and the other end with the optical detection device comprises the steps of:

applying the adhesive to regions of the light source device and the optical detection device;

connecting one end of the optical transmission-connection medium to the region of the light source device to which the adhesive is applied, and the other end of the optical transmission-connection medium to the region of the optical detection device to which the adhesive is applied; and irradiating the regions of the light source device and the optical detection device to which the optical transmission-connection medium is connected with ultraviolet (UV) light.

3. The method of claim 2, further comprising the step of:

testing whether or not the optical transmission-connection medium is properly connected with the light source device or the optical detection device by connecting an optical power meter with the one end of the optical transmission-connection medium when the other end of the optical transmission-connection medium is connected to the region of the light source device or the optical detection device.

4. The method of claim 3, wherein the step of directly connecting one end of the surface-finished optical transmission-connection medium with the light source device and the other end with the optical detection device comprises the step of:

driving the optical transmission unit or the optical detection unit and checking whether or not the optical transmission-connection medium is properly connected with the light source device or the optical detection device.

5. The method of claim 1, wherein the flexible optical waveguide has the form of a two-dimensional sheet with at least one layer of polyimide film attached on at least one surface of the two-dimensional sheet.

* * * * *